(12) United States Patent
Hebert

(10) Patent No.: US 9,087,942 B2
(45) Date of Patent: *Jul. 21, 2015

(54) OPTICAL SENSORS FOR DETECTING RELATIVE MOTION AND/OR POSITION AND METHODS AND SYSTEMS FOR USING SUCH OPTICAL SENSORS

(71) Applicant: Intersil Americas LLC, Milpitas, CA (US)

(72) Inventor: Francois Hebert, San Mateo, CA (US)

(73) Assignee: INTERSIL AMERICAS LLC, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/595,499

(22) Filed: Jan. 13, 2015

(65) Prior Publication Data

US 2015/0123232 A1   May 7, 2015

Related U.S. Application Data

(60) Continuation of application No. 14/102,245, filed on Dec. 10, 2013, now Pat. No. 8,957,491, which is a division of application No. 13/584,623, filed on Aug. 13, 2012, now Pat. No. 8,637,907, which is a continuation-in-part of application No. 13/466,867, filed on May 8, 2012, now abandoned.

(60) Provisional application No. 61/666,666, filed on Jun. 29, 2012, provisional application No. 61/496,336, filed on Jun. 13, 2011, provisional application No. 61/534,314, filed on Sep. 13, 2011.

(51) Int. Cl.
*H01L 31/0232*   (2014.01)
*H01L 21/00*   (2006.01)
*H01L 31/0216*   (2014.01)
*G02B 5/20*   (2006.01)

(52) U.S. Cl.
CPC .... *H01L 31/02327* (2013.01); *H01L 31/02162* (2013.01); *G02B 5/208* (2013.01)

(58) Field of Classification Search
CPC ................................................. H01L 31/02327
USPC .............. 257/228, 293, 436, 461; 438/57, 65
See application file for complete search history.

(56) References Cited

U.S. PATENT DOCUMENTS

| | | | |
|---|---|---|---|
| 5,753,375 | A | 5/1998 | Ray |
| 5,801,373 | A | 9/1998 | Oozu et al. |
| 6,218,719 | B1 | 4/2001 | Tsang |
| 6,596,981 | B1 | 7/2003 | Aswell et al. |
| 6,743,652 | B2 | 6/2004 | Thomas et al. |
| 7,163,832 | B2 | 1/2007 | Kim |

(Continued)

OTHER PUBLICATIONS

Wang et al., "AN Angle-Sensitive CMOS Imager for Single-Sensor 3D Photography," IEEE International Solid State Conference, Feb. 23, 2011, pp. 412-414.

(Continued)

*Primary Examiner* — Calvin Lee
(74) *Attorney, Agent, or Firm* — Vierra Magen Marcus LLP

(57) ABSTRACT

An optical sensor, according to an embodiment of the present invention, includes a photodetector region and a plurality of slats over the photodetector region. In an embodiment, the slats are made of an opaque polymer material, such as an opaque photoresist. In an embodiment, the slats are angled relative to a surface of the photodetector region.

19 Claims, 9 Drawing Sheets

(56) References Cited

U.S. PATENT DOCUMENTS

| | | |
|---|---|---|
| 7,250,311 B2 | 7/2007 | Aoki et al. |
| 7,394,059 B2 | 7/2008 | Fukuyoshi et al. |
| 7,485,486 B2 | 2/2009 | Zheng et al. |
| 7,521,737 B2 | 4/2009 | Augusto |
| 7,572,571 B2 | 8/2009 | Moon |
| 7,710,477 B2 | 5/2010 | Nam et al. |
| 8,158,988 B2 | 4/2012 | Gambino et al. |
| 8,164,126 B2 | 4/2012 | Moon et al. |
| 8,274,101 B2 | 9/2012 | Venezia et al. |
| 8,278,690 B2 | 10/2012 | Mao et al. |
| 8,319,303 B2 | 11/2012 | Yang et al. |
| 8,637,907 B2 * | 1/2014 | Hebert .......................... 257/233 |
| 8,957,491 B2 * | 2/2015 | Hebert .......................... 257/436 |
| 2005/0186754 A1 | 8/2005 | Kim |
| 2005/0287479 A1 | 12/2005 | Moon |
| 2008/0191298 A1 | 8/2008 | Lin et al. |
| 2012/0313201 A1 | 12/2012 | Herbert et al. |

OTHER PUBLICATIONS

Office Action dated Sep. 18, 2014, in U.S. Appl. No. 14/102,245, filed Dec. 10, 2013.

Amendment dated Oct. 22, 2014, in U.S. Appl. No. 14/102,245, filed Dec. 10, 2013.

Notice of Allowance dated Oct. 29, 2014, in U.S. Appl. No. 14/102,245, filed Dec. 10, 2013.

* cited by examiner

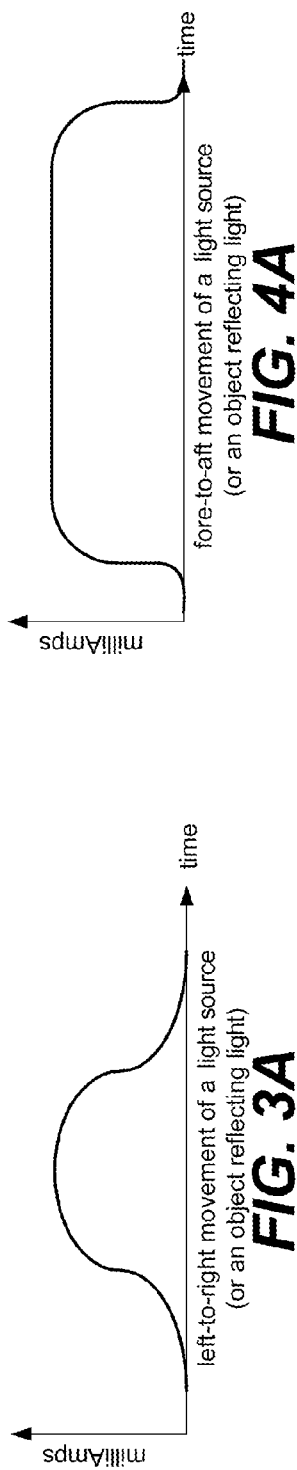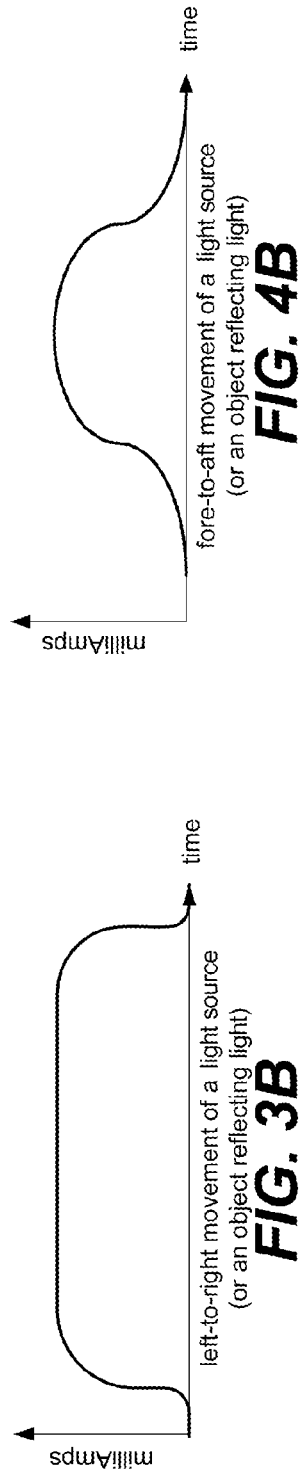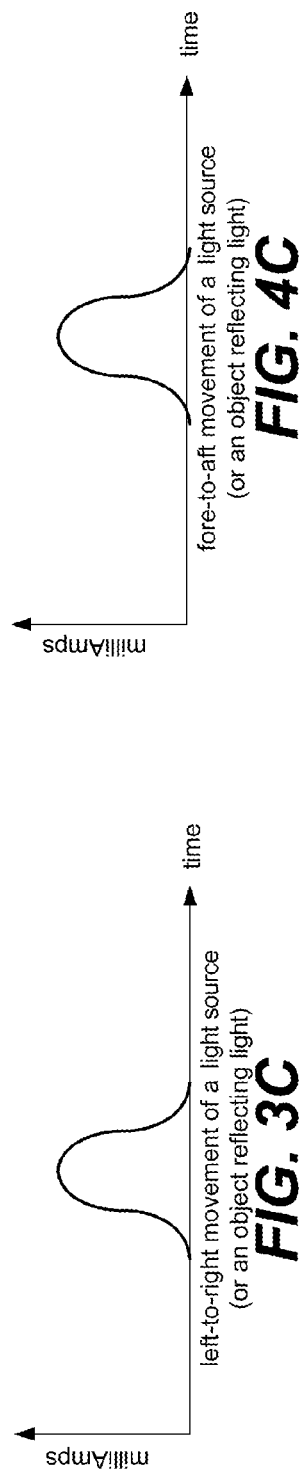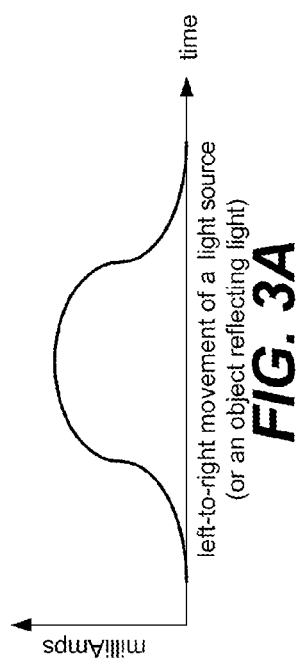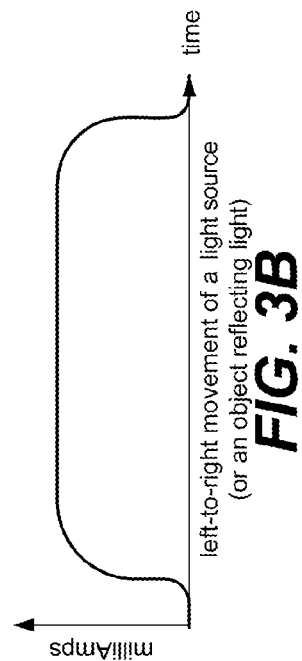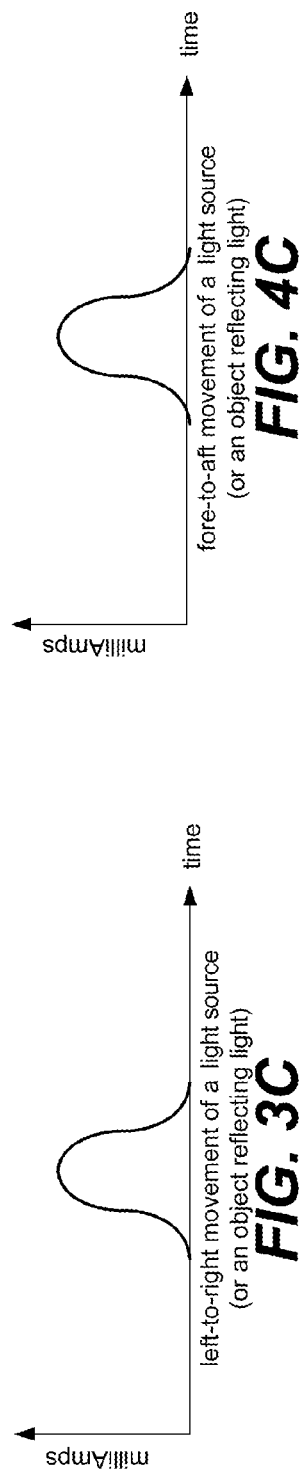

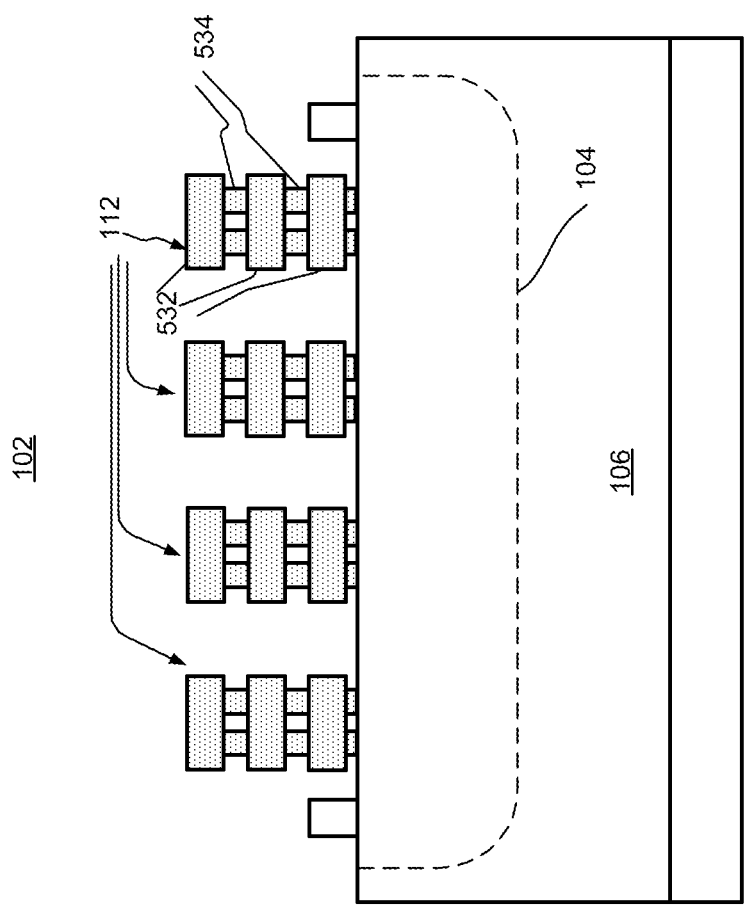

OPTICAL SENSORS FOR DETECTING RELATIVE MOTION AND/OR POSITION AND METHODS AND SYSTEMS FOR USING SUCH OPTICAL SENSORS

PRIORITY CLAIMS

This application is a continuation of U.S. patent application Ser. No. 14/102,245, filed Dec. 10, 2014, now U.S. Pat. No. 8,957,491, issued Feb. 17, 2015, which is a divisional of U.S. patent application Ser. No. 13/584,623, filed Aug. 13, 2012, now U.S. Pat. No. 8,637,907, which claims priority under 35 U.S.C. 119(e) to U.S. Provisional Patent Application No. 61/666,666, filed Jun. 29, 2012.

U.S. patent application Ser. No. 13/584,623 is a continuation-in-part (CIP) of U.S. patent application Ser. No. 13/466,867, filed May 8, 2012, now abandoned, which claims priority under 35 U.S.C. 119(e) to U.S. Provisional Patent Application No. 61/496,336, filed Jun. 13, 2011, and U.S. Provisional Patent Application No. 61/534,314, filed Sep. 23, 2011.

Priority is claimed to each of the above applications.

Each of the above applications is incorporated herein by reference.

BACKGROUND

Technologies, such as touch sensitive screens, have allowed users to provide inputs to electronic devices, such as mobile phones and tablet computers, without requiring the use of a mouse and/or a keyboard. Examples of touch sensitive screens include capacitive sensors, pressure sensitive membranes, beam break techniques with circumferential light sources and sensors, and acoustic ranging techniques. However, these types of interfaces can only provide information to the device regarding the touch event, itself, and thus can be limited in application. In addition, such types of interfaces can be limited in the number of touch events that can be handled over a given amount of time, and can be prone to interpret unintended contacts, such as from a shirt cuff or palm, as touch events.

As an alternative to touch sensitive screens, optical motion and/or gesture recognition sensors have been developed, which can be used to recognize different motions of an object (e.g., a persons finger) within the sense region of the sensor. Typically, such optical sensors rely on multiple spatially dispersed light sources, multiple spatially dispersed light detectors, or both, to enable them to distinguish between motion in one or two directions. For example, one existing sensor includes a photodetector that is flanked on both sides by infrared light emitting diodes (IR-LEDs) spaced several tens of millimeters away from the photodetector to provide sufficient angular resolution, and a third IR-LED that is spaced several tens of millimeters away from the photodetector in a direction orthogonal to the line of the first two IR-LEDs and the photodetector. The IR-LEDs are pulsed one at a time, sequentially, such that the detected reflected light signals can be associated with the correct light source and its known location relative to the photodetector. From the detected reflected light pulses, a gesture recognition algorithm determines the direction and velocity of a target object, such as a user's finger.

A disadvantage of the exemplary configuration described above is that it requires at least three spatially dispersed light sources to detect movement in two directions (e.g., the x-direction and the y-direction), or at least two spatially dispersed light sources to detect movement in one direction (e.g., only the x-direction). Accordingly, such a configuration requires a relatively large footprint because of the spatial distances required between the light sources and the optical sensor.

BRIEF DESCRIPTION OF THE DRAWINGS

FIGS. 3A and 4A are exemplary current versus time responses for the optical sensor of FIGS. 1A and 2A.

FIGS. 3B and 4B are exemplary current versus time responses for the optical sensor of FIGS. 1B and 2B.

FIGS. 3C and 4C are exemplary current versus time responses for the optical sensor of FIGS. 1C and 2C.

FIG. 5A illustrates how the slats shown in earlier FIGS. can be made of metal during BEOL metallization process steps.

DETAILED DESCRIPTION

Figure 1A:
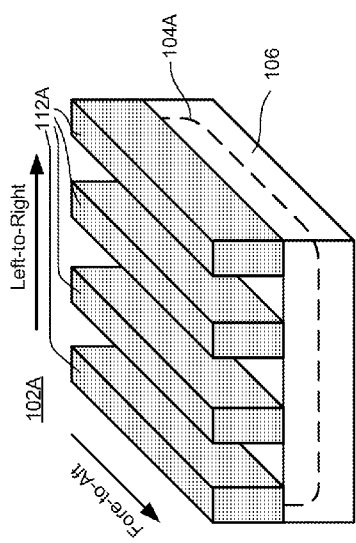
FIG. 1A illustrates a perspective view of an optical sensor including a photodetector region above which are located parallel slats.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Figure 1B:
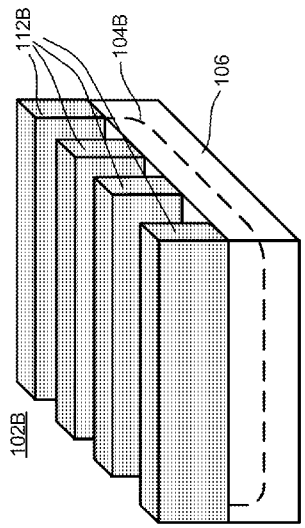
FIG. 1B illustrates a perspective view of an optical sensor including a photodetector region above which are located parallel 1 slats that are orthogonal to the slats in FIG. 1A.
Figure 1C:
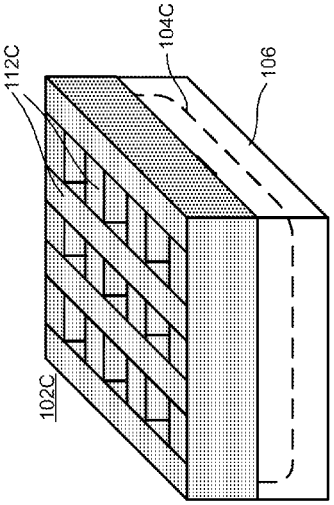
FIG. 1C illustrates a perspective view of an optical sensor including a photodetector region above which are located crisscrossing slats.
Figure 2A:
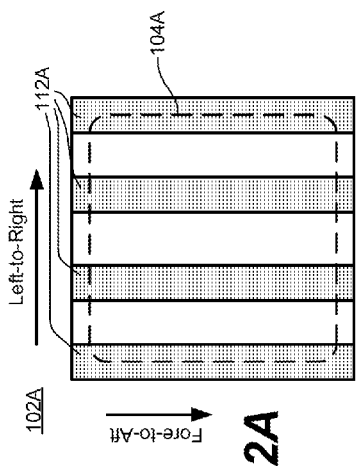
FIG. 2A is a top view of the optical sensor of FIG. 1A.
Figure 2B:
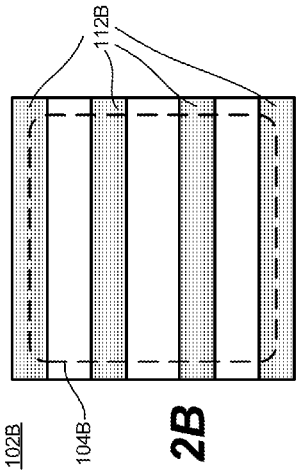
FIG. 2B is a top view of the optical sensor of FIG. 1B.
Figure 2C:
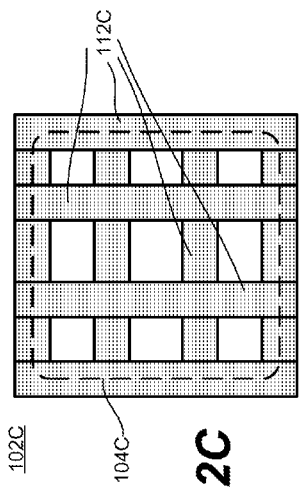
FIG. 2C is a top view of the optical sensor of FIG. 1C.

FIG. 1A illustrates a perspective view of an optical sensor 102A, according to an embodiment of the present invention. The optical sensor 102A includes a photodetector (PD) region 104A above which are located parallel slats 112A. FIG. 1B illustrates a perspective view of an optical sensor 102B including a PD region 104B above which are located parallel slats 112B, which are orthogonal to the slats 112A in FIG. 1A. FIG. 1C illustrates a perspective view of an optical sensor 102C including a PD region 104C above which are located crisscrossing slats 112C. FIGS. 2A, 2B and 2C illustrate, respectively, top views of the optical sensors 102A, 102B and 102C. The sensors 102A, 102B and 102C can be collectively or individual referred to as sensor(s) 102, the PD regions 104A, 104B and 104C can collectively or individually be referred to as PD region(s) 104, and the slats 112A, 112B and 112C can be collectively or individually referred to as slat(s) 112.

Each PD region 104, which is formed in a semiconductor wafer substrate 106, can be, e.g., a photodiode, photoresistor, a photovoltaic cell, a phototransistor, or a charge-coupled device (CCD), but is not limited thereto, and can be used to produce a current or voltage indicative of detected light. Unless stated otherwise, for consistency, it will be assumed that each PD region 104 is a photodiode that produces a current indicative of detected light. In accordance with specific embodiments, all of the optical sensors 102A, 102B and 102C are fabricated in a same wafer substrate 106, and thus, on a same die.

Figure 5B:
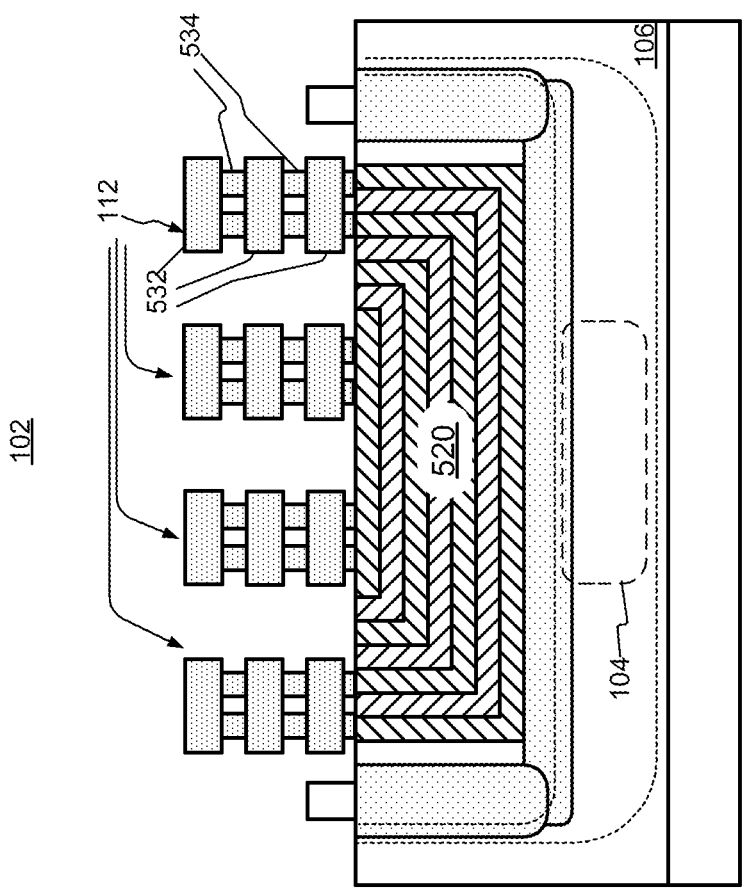
FIG. 5B is similar to FIG. 5A, but illustrates how a filter can be formed in a trench under the slats.

In accordance with specific embodiments of the present invention, the slats 112 are made of metal and are formed during back-end-of-line (BEOL) metallization process steps. Additional details of how metal slats can be formed are discussed below with reference to FIGS. 5A and 5B. Alternatively, the slats 112 can be made of an opaque polymer material, e.g., such as an opaque (e.g., black or green) photoresist.

In accordance with specific embodiments, one or more filters is/are formed above and/or below the slats 112. For example, an inorganic dielectric optical filter that rejects infrared (IR) light, which can also be referred to as an IR-cut filter, can be formed below the slats 112 in a trench, as described below with reference to 5B. Alternatively, such an inorganic dielectric optical filter can be designed to reject visible light and pass IR-light. The design of the filter(s) will depend on the system in which optical sensor is be used. In other embodiments, the filter(s) are deposited and thereby formed above the slats 112. Additionally, or alternatively, one or more organic color filter(s) can be used.

In accordance with certain embodiments of the present invention, the optical sensors 102A and 102B are collectively used to detect motion of an object (or a light source) relative to the sensors 102. The optical sensor 102C is used to detect when an object (or a light source) is directly over the sensor 102C. More specifically, in accordance with certain embodiments of the present invention, the current versus time responses of the optical sensors 102A and 102B are used to detect whether an object is moving in a first direction (e.g., left-to-right) relative the sensors, or in a second direction (e.g., fore-to-aft) relative to the sensors that is generally orthogonal to the first direction. The current versus time response of the optical sensor 102C is used to detect when an object (or a light source) is substantially directly over the sensor 102C. Exemplary current versus time responses for the optical sensors 102A, 102B and 102C are illustrated and described below with reference to FIGS. 3A-3C and 4A-4C.

The sensors 102 can be used in various different manners. For example, referring to FIG. 1D, the sensors 102 can be used to detect light transmitted by an adjacent light source 122 that has reflected off of an object 132. For another example, rather than detecting reflected light, the sensors 102 can detect light transmitted from a light source that is generally in line with the sensors 102, as well as the blocking of such light. In accordance with certain embodiments, the light source 122 can be, e.g., an infrared (IR) light emitting diode (LED) or laser diode. However, other types of light sources and alternative wavelengths of light can be used. These embodiments can be better understood with references to FIGS. 3A-3C and 4A-4C described below. If filter(s) is/are used with the configuration shown in FIG. 1D, the filter(s) should pass light of the wavelengths produced by the light source 122 (e.g., IR wavelengths) and reject light of other wavelengths (e.g., visible wavelengths).

Figure 1D:
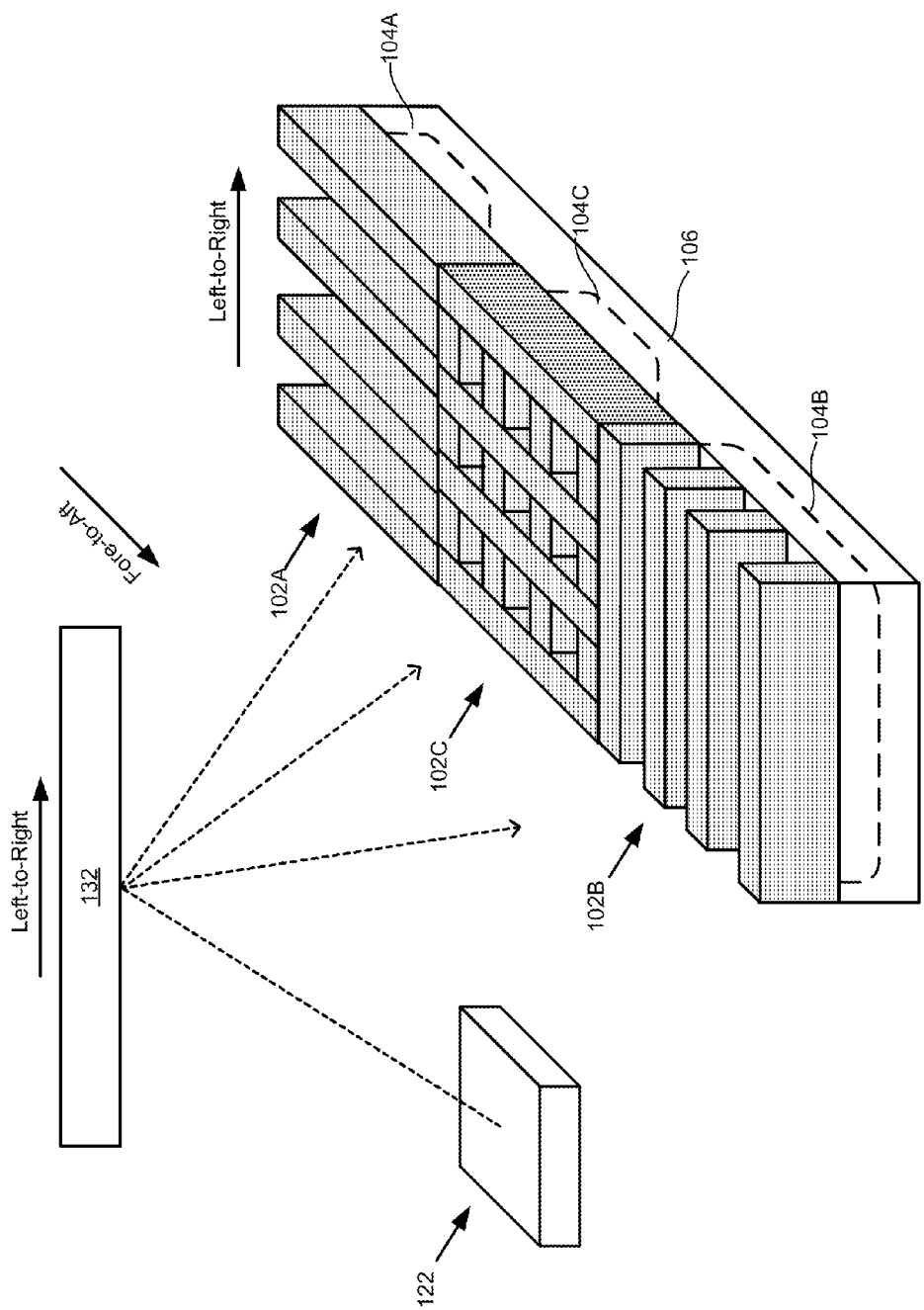
FIG. 1D illustrates how the optical sensors of FIGS. 1A, 1B and 1C can be configured with a light source to detect light originating from the light source that has been reflected off of an object moving relative to the sensors.

Assuming the configuration shown in FIG. 1D (where the sensors 102A, 102B and 102C are used with the light source 122), FIGS. 3A, 3B and 3C illustrate exemplary current versus time responses, respectively, for the optical sensors 102A, 102B and 102C when the object 132 moves from left-to-right over the sensors 102. The responses in FIGS. 3A and 3B can be compared to one another in order to determine whether the object 132 is moving left-to-right, or fore-to-aft, over the sensors 102A and 102B. For example, the responses can be integrated and results of the integrations can be compared to one another (e.g., using a comparator, or using subtraction). The responses can be compared to one another in the analog domain, or the responses can be converted to the digital domain using analog-to-digital converters (ADCs) and compared in the digital domain.

Referring to FIGS. 3A and 3B, the integration of the response in FIG. 3B would be greater than the integration of the response in FIG. 3A, which is indicative of the object 132 moving left-to-right (or more generally, in the x-direction), as opposed to fore-to-aft (or more generally, in the y-direction). Referring to the response in FIG. 3A, because of the orientation of the slats 112A of the sensor 102A relative to the light reflecting from the object 132, the current response increases as the object approaches the sensor 102A from left, peaks when the object 132 is overhead, and decreases as the object moves to the right of the sensor 102A. Referring to the response in FIG. 3B, because of the orientation of the slats 112B of the sensor 102B relative to the light reflecting from the object 132, the current response stays more consistent as the object approaches the sensor 102B from left, moves overhead, and moves to the right of the sensor 102B. Referring to the response in FIG. 3C, do to the crisscross orientation of the slats 112C, there is a much more narrow response that peaks when the object is above the sensor 102C.

Similar responses to those illustrated in FIGS. 3A, 3B and 3C would occur if the sensors 102A, 102B and 102C were in line with a light source, and thus, the sensors 102 detected light transmitted directly from the light source (as opposed to reflected light). More specifically, the responses in FIGS. 3A and 3B would correspond to the light source moving left-to-right relative to the sensors 102A and 102B, respectively, or the sensors 102A and 102B moving left-to-right relative to the light source. Such a configuration can be used, e.g., to automatically align components of industrial equipment, or to monitor the motion of a game controller, or the like. For example, the sensors 102 can be attached to a first element of a system, and a light source can be attached to a second element of the system that is generally across from the first element. In this manner, alignment and/or motion of one of the elements relatively to the other can be detected and used as feedback to adjust one of the elements, or to control a further element.

Assuming the configuration shown in FIG. 1D (where the sensors 102A, 102B and 102C are used with the light source 122), FIGS. 4A, 4B and 4C illustrate exemplary current versus time responses, respectively, for the optical sensors 102A, 102B and 102C when the object 132 moves from fore-to-aft over the sensors 102. The responses in FIGS. 4A and 4B can be compared to one another in order to determine whether the object 132 is moving left-to-right, or fore-to-aft, relative to the sensors 102A and 102B.

Referring to FIGS. 4A and 4B, the integration of the response in FIG. 4A would be greater than the integration of the response in FIG. 4B, which is indicative of the object 132 moving fore-to-aft (or more generally, in the y-direction), as opposed to left-to-right (or more generally, in the x-direction). Referring to the response in FIG. 4A, because of the orientation of the slats 112A of the sensor 102A relative to the light reflecting from the object 132, the current response stays relatively consistent as the object moves fore-to-aft over the sensor 102A. Referring to the response in FIG. 4B, because of the orientation of the slats 112B of the sensor 102B relative to the light reflecting from the object 132, the current response increases as the object approaches the sensor 102A from back, peaks when it's overhead, and decreases as the object moves forward past the sensor 102B. Referring to the response in FIG. 4C, do to the crisscross orientation of the slats 112C, there is a much more narrow response that peaks when the object is above the sensor 102C.

Similar responses to those illustrated in FIGS. 4A, 4B and 4C would occur if the sensors 102A, 102B and 102C were in line with a light source, and thus, the sensors 102 detected light transmitted directly from the light source (as opposed to reflected light). More specifically, the responses in FIGS. 4A and 4B would correspond, respectively, to a light source moving fore-to-aft relative to the sensors 102A and 102B, or the sensors 102A and 102B moving fore-to-aft relative to the light source.

If there is a desire to distinguish left-to-right movement from right-to-left movement, then two of the sensors 102A can be used, e.g., one on the left, and the other one on the right. Here it would be expected that the one of the two sensors 102A closer to a moving object (that reflects light) or closer to a moving light source would produce an earlier and greater response than the one of the sensors 102A further from the object or moving light source. Similarly, if there is a desire to distinguish fore-to-aft movement from aft-to-fore movement, two of the sensors 102B can be used, with one in the forefront of the other. In other words, pairs of each type of the sensors 102A and 102B can used to provide stereoscopic capabilities. If there is a desire to distinguish between an object being located overhead relative to multiple different positions, then multiple sensors 102C can be spaced apart and used.

Reference will now be made to FIG. 5A to explain in some more detail how the slats 112 can be made of metal during BEOL metallization process steps. Referring to FIG. 5A, the stats 112 are shown as being formed from a plurality of metal layers 532, which are connected in a stacked configuration with a plurality of metal columns 534, such as vias, contacts, or plugs (e.g., Tungsten or Copper plugs).

Each metal layer can include a stack of metal layers, including, e.g., an adhesion layer (also known as a barrier layer) at the bottom (made of Ti and or TiN), a bulk conductive layer in the middle, and an anti-reflective coating (ARC) layer on the top. The adhesion layer can be, e.g., made of Titanium (Ti) and/or Titanium Nitride (TiN), but is not limited thereto. The bulk layer can be, e.g., made of Aluminum (Al), Copper (Cu) and/or Aluminum Copper (AlCu), but is not limited thereto. The ARC layer can, e.g., be made of TiN, but is not limited thereto. Each column (e.g., Tungsten or Cupper) plug can similarly include an adhesion layer at its bottom. If desired, one or more filter(s) and/or a microlens can be fabricated above the uppermost metal layer 532.

FIG. 5AB illustrates a filter 520, such as an inorganic dielectric optical filter, formed below the slats 112 in a trench. Additional details of how to form such a trench, and form a filter therein, are described in commonly assigned U.S. patent application Ser. No. 13/466,867, entitled OPTICAL SENSOR DEVICES INCLUDING FRONT-END-OF-LINE (FEOL) OPTICAL FILTERS AND METHODS FOR FABRICATING OPTICAL SENSOR DEVICES, filed May 8, 2012, which is incorporated herein by reference.

The inorganic dielectric materials used to form the dielectric optical filter (e.g., 520) can include silicon dioxide ($SiO_2$), silicon hydride ($Si_xH_y$), silicon nitride ($Si_xN_y$), silicon oxynitride ($Si_xO_zN_y$), tantalum oxide ($Ta_xO_y$), gallium arsenide (GaAs), gallium nitride (GaN), and the like. Alternating layers in the optical filter may have a constant or varying film thickness throughout the filter stack, in order to achieve the desired optical response. By careful choice of the exact composition, thickness, and number of these layers, it is possible to tailor the reflectivity and transmissivity of the optical filter to produce almost any desired spectral characteristics. For example, the filter can be designed as a long-pass or short-pass filter, a bandpass or notch filter, or a mirror with a specific reflectivity.

The slats 112A, 112B and 112C of the sensors 102A, 102B and 102C were show as being generally straight up and down and perpendicular relative to the surface of the PD regions 104A, 104B and 104C, respectively. In alternative embodiments, the slats can be slanted such that they resemble louvers or "venetian blinds", as will now be described with reference to FIGS. 6A and 6B.

Figure 6A:
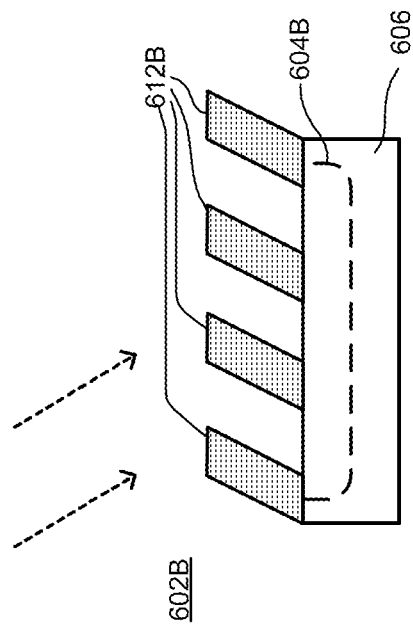
FIGS. 6A and 6B are side views of optical sensors according to further embodiments of the present invention.
Figure 6B:
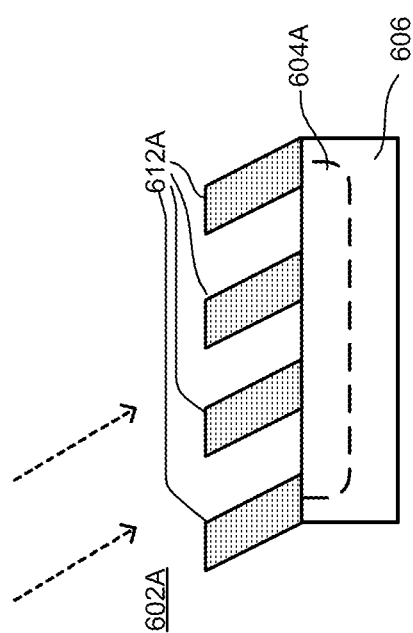

FIG. 6A illustrates a side view of an optical sensor 602A, according to an embodiment of the present invention. The optical sensor 602A includes a PD region 604A above which are located parallel slanted slats 612A, which can also be referred to as louvers 612A. More specifically, the louvers 612A slant downward from left to right. FIG. 6B illustrates a side view of an optical sensor 602B, according to an embodiment of the present invention. The optical sensor 602B includes a PD region 604B above which are located parallel slanted slats 616B, which can also be referred to as louvers 612B. More specifically, the louvers 612B slant downward from right to left. The PD regions 604A and 604B are formed in a semiconductor wafer substrate 606.

The angled slats 612A of the sensor 602A enable the sensor 602A to primarily detect light have a first angle of incidence, whereas the slats 612B of the sensor 602B enable the sensor 602B to detect light having a second angle of incidence. This enables the sensors 602A and 602B to be used together to detect whether an object (that reflects light from a light source), or a light source, is moving from left-to-right relative to the sensors 602A and 602B, or from right-to-left. Assume a similar configuration to that shown in FIG. 1D, but assume the sensors 602A and 602B are used in-place of the sensors 102A and 102B, respectively. If an object that reflects light produced by a light source is moving from the left toward the sensors, then the sensor 602A will produce an earlier and greater response than the sensor 602B. Similarly, if a light source is moving from the left toward the sensors (or is to the left of the sensors), then the sensor 602A will produce an earlier and greater response than the sensor 602B. If an object that reflects light produce by a light source is moving from the right toward the sensors, then the sensor 602B will produce an earlier and greater response than the sensor 602A. Similarly, if a light source is moving from the right toward the sensors (or is to the right of the sensors), then the sensor 602B will produce an earlier and greater response than the sensor 602A.

It is also with the scope of the present invention to include numerous sensors similar to those shown in FIGS. 6A and 6B, with each sensor having slats 612 having a different angle than the other sensors, to thereby enable the sensors to collectively be used to detect where an object that reflects light (or a light source that transmits light) is relative to the sensors, by comparing the response of the numerous sensors.

Further sensors having slanted slats, similar to those in sensors 602A and 602B, but having slats orthogonal to those of the sensors 602A and 602B can be used together to detect whether an object (that reflects light from a light source), or a light source, is moving from fore-to-aft or aft-to-fore.

Figure 7:
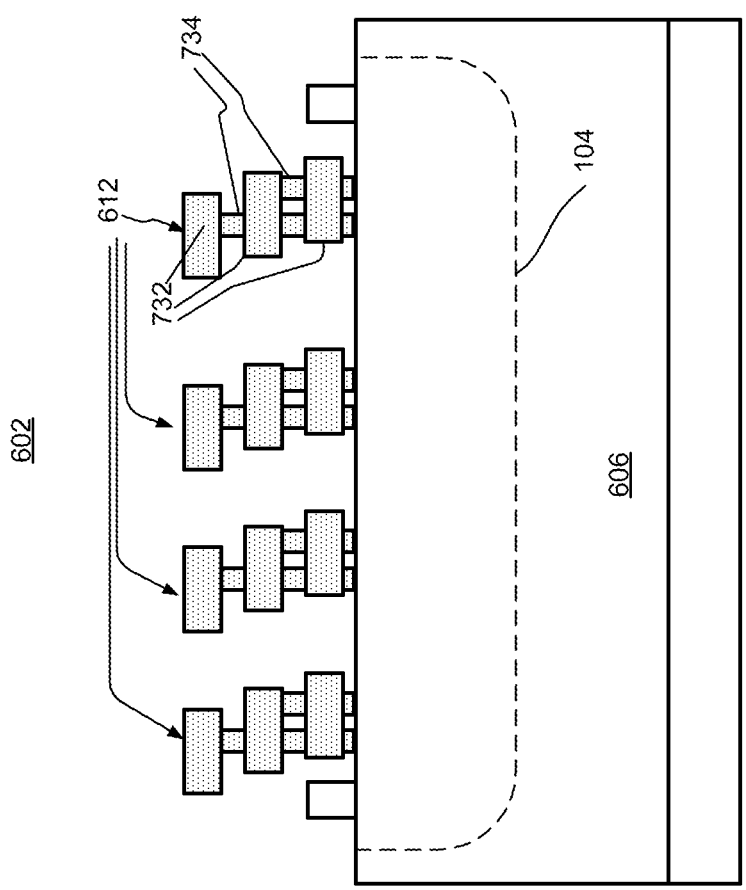
FIG. 7 illustrates how the slanted slats shown in FIGS. 6A and 6B can be made of metal during BEOL metallization process steps.

FIG. 7 illustrates that the slanted slats 612 can be made of metal, during BEOL metallization process steps, from a plurality of metal layers 732, which are connected in a stacked configuration with a plurality of metal columns 734, such as vias, contacts, or tungsten plugs. More specifically, the slanted slats can be made by laterally offsetting, by a predetermined lateral spacing, the various metal layers 732 and/or columns 734 that are stacked one above the other to make up each slat. If desired, one or more filter(s) can be fabricated above the uppermost metal layer 732, are below the slats in a trench, as was discussed above with reference to FIGS. 5A and 5B.

Embodiments of the present invention can be used to detect simple gestures such as horizontal left-to-right motion, horizontal right-to-left motion, vertical up-to-down (i.e., fore-to-aft) motion and vertical down-to-up (i.e., aft-to-fore) motion. The detected simple gestures can be used, e.g., to control a parameter (such as volume and/or brightness) of an electronic device, to move a cursor on a screen, or to control operation of a video game, but is not limited thereto.

Figure 8:
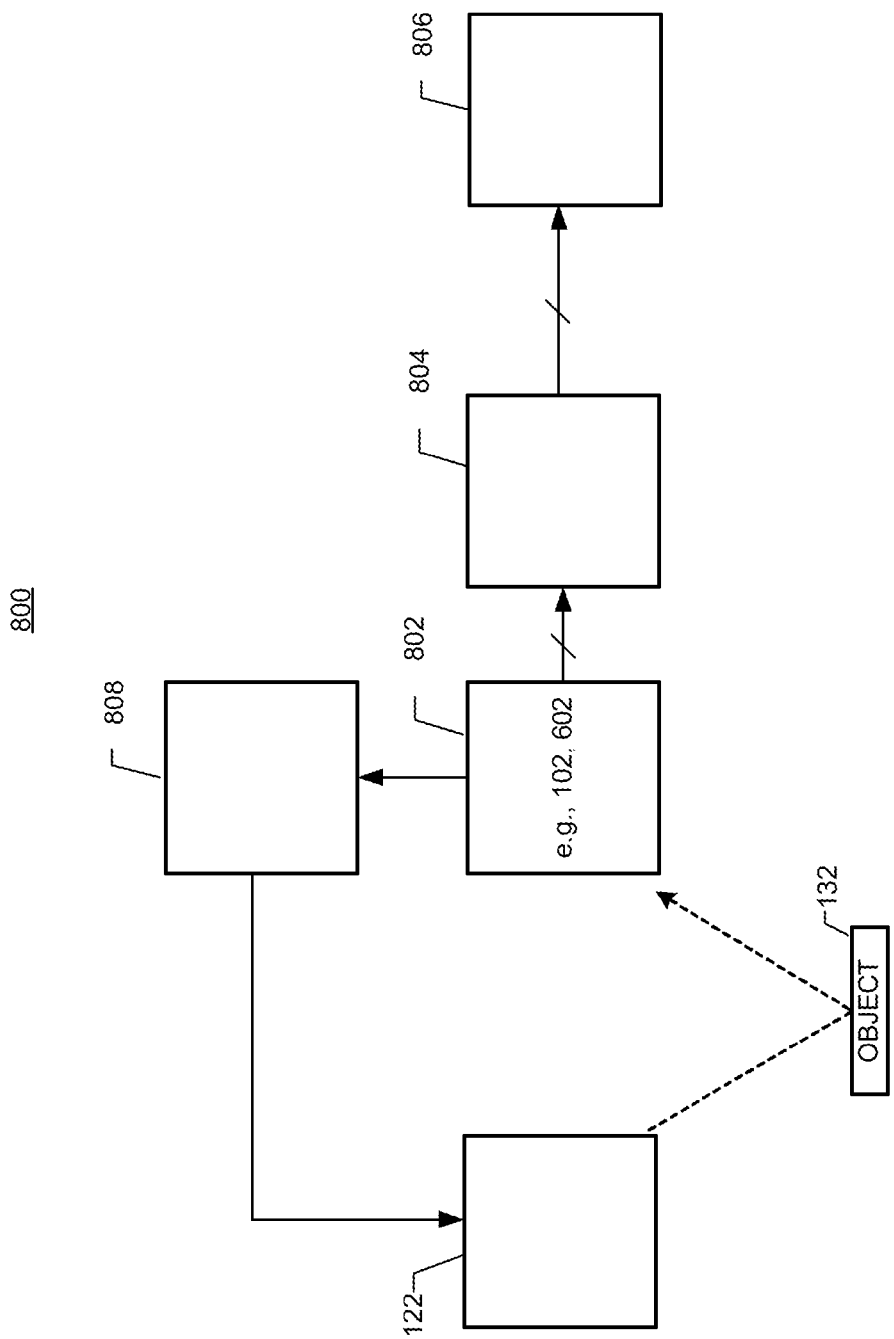
FIG. 8 is a high level block diagram of a system according to an embodiment of the present invention.

FIG. 8 is a high level block diagram of a system according to an embodiment of the present invention. Optical sensors of embodiments of the present invention can be used in various systems, including, but not limited to, mobile phones, tablets, personal data assistants, laptop computers, netbooks, other handheld-devices, as well as non-handheld-devices. Referring to the system 800 of FIG. 8, a plurality of optical sensors (e.g., 102 and/or 602) described herein, collectively represented by block 802, can be used to control whether a subsystem 806 (e.g., a touch-screen, display, backlight, virtual scroll wheel, virtual keypad, navigation pad, audio speaker etc.) is enabled or disabled, and whether the brightness, volume or other parameter of the subsystem is increased, decreased or otherwise modified. Referring to FIG. 8, a processor and/or other circuitry 804 (e.g., amplifiers, integrators, ADCs, comparators, subtraction circuitry, etc.) can detect motion and or relative positions based on responses produced by the optical sensors 802, e.g., in order to determine whether a motion or gesture has been detected that is intended to control the subsystem 806, and the processor and/or other circuitry 804 can control the subsystem 806 accordingly. The processor and/or other circuitry 804 can also include registers and/or memory that is used to store motion and/or position detection data. The system can also include a driver 808 configured to selectively drive the light source 122. Such a driver can be part of, or separate from, the processor and/or other circuitry 804.

Figure 9:
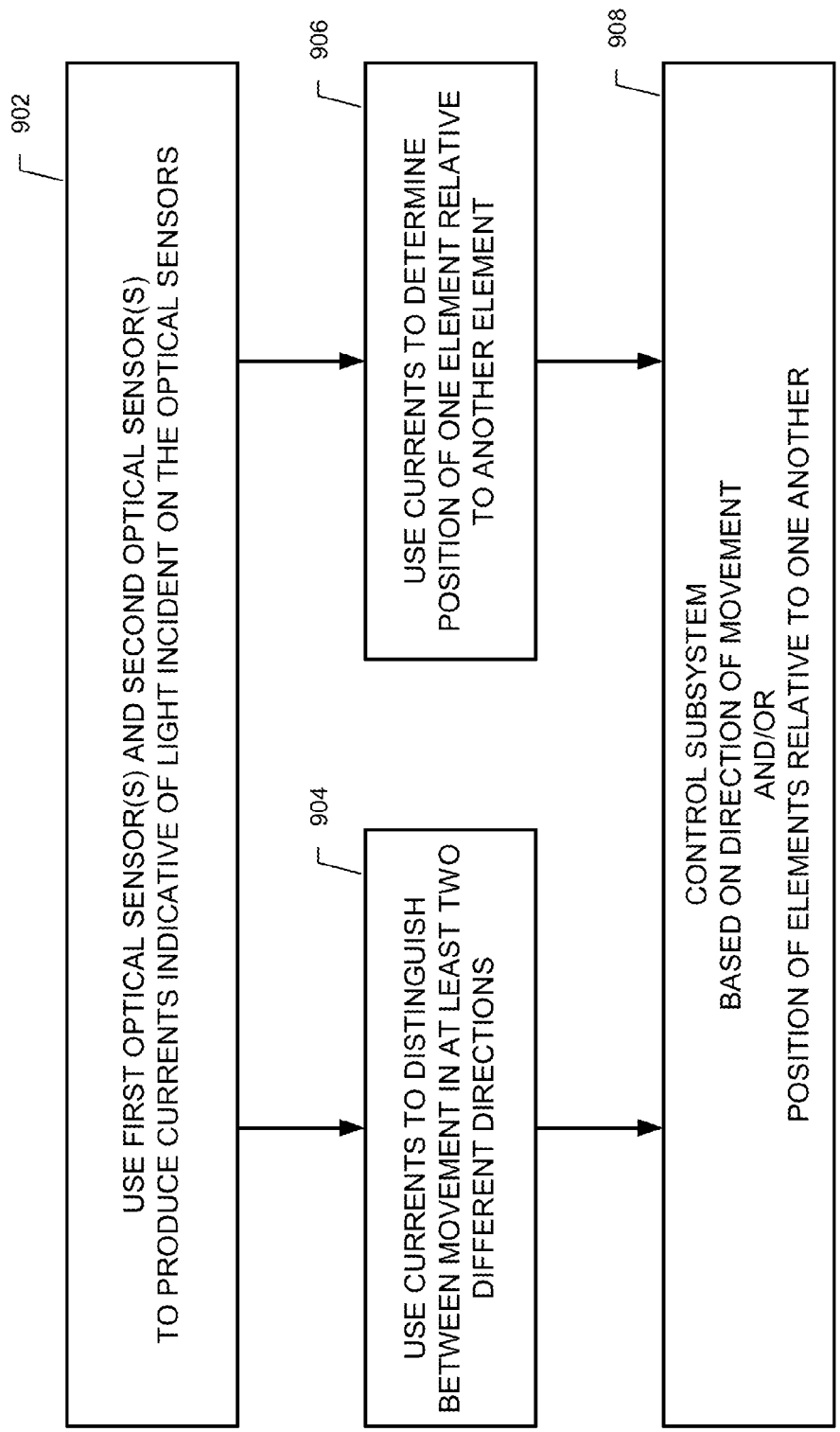
FIG. 9 is a high level block diagram that is used to describe methods according to various embodiments of the present invention.

FIG. 9 is a high level block diagram that is used to describe methods according to various embodiments of the present invention. Such methods are for use with one or more first optical sensors each including a photodetector region and a plurality of first slats over the photodetector region, and one or more second optical sensors each including a photodetector region and a plurality of second slats over the photodetector region, wherein the second slats have a different configuration than the first slats. Exemplary optical sensors that can be used for such methods were described above with reference to FIGS. 1-8. For example, as was described above, the second slats can be orthogonal relative to the first slats. Additionally, or alternatively, the first slats can slant in a first direction, and the second slats can slant in a second direction generally opposite the first direction. Referring to FIG. 9, at step 902, the first optical sensor(s) and the second optical sensor(s) are used produce currents indicative of light incident on the optical sensors. At steps 904 and/or 906, the currents produced at step 902 are used to distinguish between movement in at least two different directions and/or determine a position of one element of relative to another element. At step 908, the results of steps 904 and/or 906 are used to control a subsystem.

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art.

Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. An optical sensor, comprising:
    a semiconductor wafer substrate;
    a photodetector region formed in the semiconductor wafer substrate; and
    a plurality of slats formed over the photodetector region such that light that is incident on the optical sensor passes by the slats before reaching the photodetector region;
    wherein the slats are made of an opaque polymer material.

2. The optical sensor of claim 1, wherein the opaque polymer material of which the slats are made comprises an opaque photoresist.

3. The optical sensor of claim 1, wherein the slats are parallel to one another.

4. The optical sensor of claim 1, wherein the slats are slanted relative to a surface of the photodetector region.

5. The optical sensor of claim 1, wherein a first subset of the slats crisscross a second subset of the slats, wherein each of the first and second subsets of the slats include a plurality of the slats.

6. The optical sensor of claim 1, further comprising an optical filter above the slats.

7. The optical sensor of claim 6, wherein the optical filter is configured to reject infrared light.

8. The optical sensor of claim 6, wherein the optical filter is configured to reject visible light and pass infrared light.

9. The optical sensor of claim 1, further comprising an optical filter between the slats and the photodetector region.

10. The optical sensor of claim 9, wherein the optical filter is configured to reject infrared light.

11. The optical sensor of claim 9, wherein the optical filter is configured to reject visible light and pass infrared light.

12. An optical sensor, comprising:
    a semiconductor wafer substrate;
    a photodetector region formed in the semiconductor wafer substrate; and
    a plurality of slats formed over the photodetector region such that light that is incident on the optical sensor passes by the slats before reaching the photodetector region;
    wherein the slats are slanted relative to a surface of the photodetector region.

13. The optical sensor of claim 12, wherein the slats are parallel to one another.

14. The optical sensor of claim 12, further comprising an optical filter above the slats.

15. The optical sensor of claim 14, wherein the optical filter is configured to reject infrared light.

16. The optical sensor of claim 14, wherein the optical filter is configured to reject visible light and pass infrared light.

17. The optical sensor of claim 12, further comprising an optical filter between the slats and the photodetector region.

18. The optical sensor of claim 17, wherein the optical filter is configured to reject infrared light.

19. The optical sensor of claim 17, wherein the optical filter is configured to reject visible light and pass infrared light.

\* \* \* \* \*